United States Patent [19]
Plus

[11] Patent Number: 5,136,622
[45] Date of Patent: Aug. 4, 1992

[54] SHIFT REGISTER, PARTICULARLY FOR A LIQUID CRYSTAL DISPLAY

[75] Inventor: Dora Plus, South Bound Brook, N.J.

[73] Assignee: Thomson, S.A., Courbevoie, France

[21] Appl. No.: 660,271

[22] Filed: Feb. 28, 1991

[51] Int. Cl.[5] .............................................. G11C 19/00
[52] U.S. Cl. ....................................... 377/64; 377/78; 377/79
[58] Field of Search .................... 377/70, 74, 75, 76, 377/77, 78, 79, 104, 105, 106, 64

[56] References Cited

U.S. PATENT DOCUMENTS

| | | | |
|---|---|---|---|
| 4,017,741 | 4/1977 | Briggs | 377/79 |
| 4,418,418 | 11/1983 | Aoki | 377/74 |
| 4,890,308 | 12/1989 | Imai | 377/76 |

OTHER PUBLICATIONS

Gaenssler et al., "Noncomplementary Static Shift Register", Oct. 1970, p. 1349.

Primary Examiner—Stanley D. Miller
Assistant Examiner—Sinh Tran
Attorney, Agent, or Firm—J. S. Tripoli; D. H. Irlbeck; L. L. Hallacher

[57] ABSTRACT

A shift register includes transistors having conduction paths serially connected at a node and between an input terminal receiving a constant voltage and a clocked terminal receiving a clocked voltage of a first phase. The control electrode of one of the transistors receives a clocked voltage of a second phase and the control electrode of the other transistor receives an input signal. An inverter is arranged between the node and the output terminal.

8 Claims, 2 Drawing Sheets

SHIFT REGISTER, PARTICULARLY FOR A LIQUID CRYSTAL DISPLAY

BACKGROUND

This invention relates generally to shift registers and particularly to a shift register useful as a select line scanner for LCD displays.

Liquid crystal television and computer displays (LCDs) are known in the art. For example, see U.S. Pat. Nos. 4,742,346 and 4,766,430, both issued to G. G. Gillette et al. and incorporated herein by reference. Displays of the type described in the Gillette patents include a matrix of liquid crystal cells which are arranged at the crossovers of data lines and select lines. The select lines are sequentially selected by a select line scanner to produce the horizontal lines of the display. The data lines apply the brightness signals to the columns of liquid crystal cells as the select lines are sequentially selected. Each liquid crystal cell is associated with a switching device through which a ramp voltage is applied to the liquid crystal cells in the selected line. Each of the switching devices is held on by a comparator, or a counter, which receives the brightness (grey scale) signal to permit the ramp voltage to charge the associated liquid crystal cell to a voltage proportional to the brightness level received by the comparator from the data input line.

Preferably, the drive circuitry, which drives the data lines, and the select line scanner, which selects the horizontal lines to be displayed, are fabricated directly onto the same substrate as the liquid crystal cells at the same time that the switching devices are fabricated. Also, because a large number of data lines and select lines are required for a television or computer display it is essential to keep the circuitry as simple as possible in order to obtain high manufacturing yield. For these reasons, there is a need for a simple, reliable select line scanner for use in liquid crystal displays. The invention fulfills this need by a provision of a multistage shift register wherein each stage is comprised of only four solid state devices which, preferably, are thin film transistors (TFT's).

CROSS REFERENCE TO RELATED APPLICATIONS

The Present invention can be used with the invention described in application Ser. No. 660,274 filed concurrently herewith by Amtonine DuPont and Dora Plus and titled "Redundant Shift Register For Scanning Devices".

SUMMARY

A shift register comprises a plurality of substantially identical cascaded stages. The stages each include a first pair of solid state devices, of opposite conductivity type, having conduction paths connected at a node. The control electrode of one of the solid state devices receives a clock signal, the control electrode of the other solid state device is connected to the input terminal, and the conduction path of the other solid state device receives the complement of the clock signal. An inverter is arranged between the node and the output terminal for holding the voltage on the output terminal opposite from that on the node. Each stage provides an input pulse to the immediately succeeding stage of the shift register when its output terminal is high, or activated.

DETAILED DESCRIPTION

Figure 1:
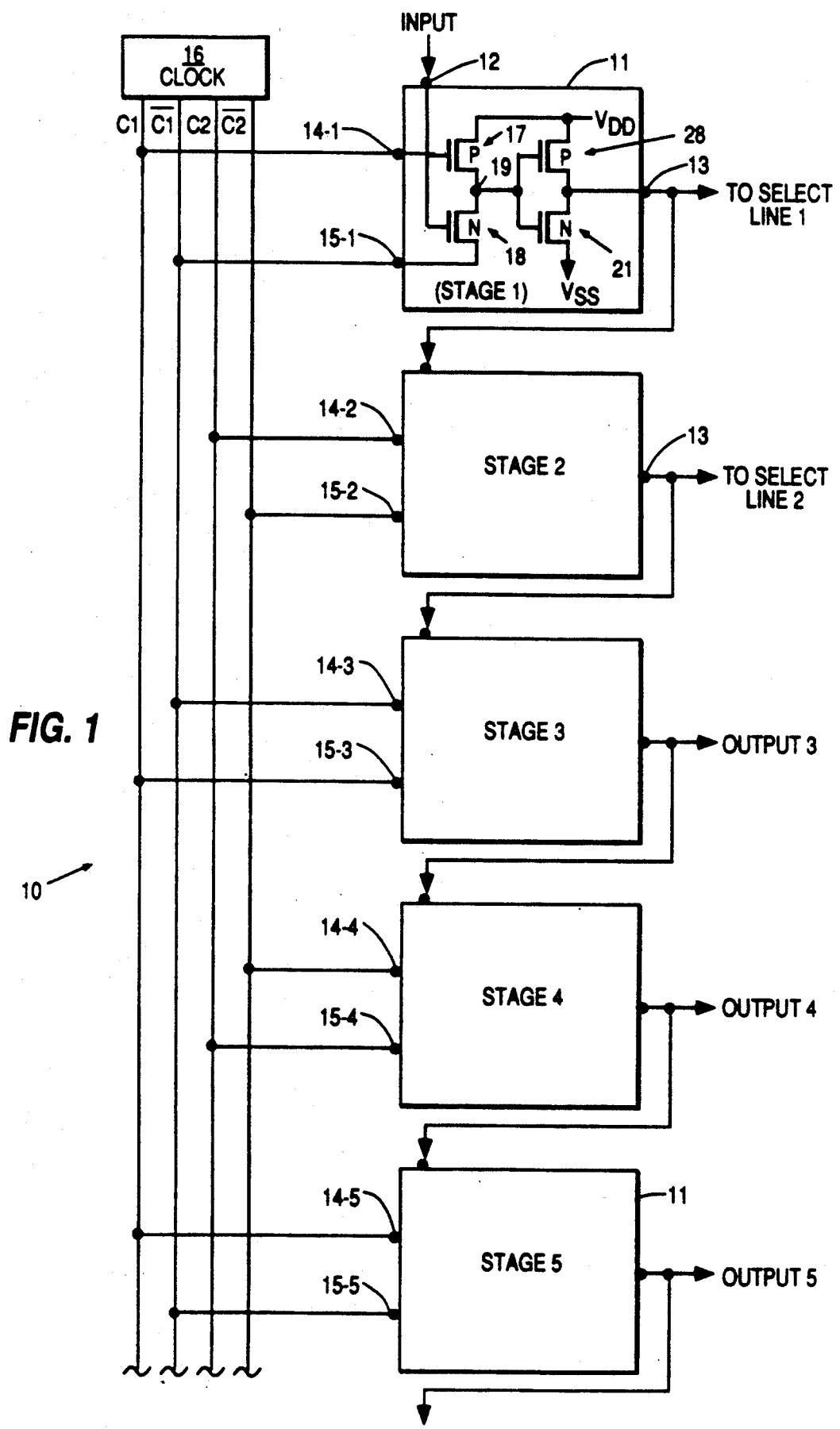
FIG. 1 is a block diagram of a preferred embodiment of the inventive shift register, including the details of each register stage.

In FIG. 1, a shift register 10 includes ak plurality of substantially identical stages 11, one of each horizontal line of the display in which the shift register is to be used, and only five of which are shown. Each stage 11 includes an input terminal 12 and an output terminal 13. The stages 11 are cascaded by connecting the output terminal 13 of each stage to the input terminal 12 of the immediately succeeding stage. Each stage also includes first and second clock terminals 14 and 15, respectively. A clock generator 16 provides two clock signals C1 and C2 and their complements $\overline{C1}$ and $\overline{C2}$. Clock terminals 14 and 15 of each stage receive a clock signal and its complement in the order shown in FIG. 1. The stages 11 are ordinally numbered and arranged in groups of four in accordance with their connection to the clock signals C1 and C2. Thus, the first and third stage of each group receive clock C1 and its complement $\overline{C1}$. However, stage 1 receive clock C1 on the first clock terminal 14-1 while stage 3 receives clock C1 on the second input terminal 15-3. Similarly, stages 2 and 4 of each group receive clock C2 and clock $\overline{C2}$ on opposite clock terminals. The four stages in each subsequent group receive clocks C1 and C2 in the same sequence as stages 1 to 4 in accordance with the ordinal numbering of the stages.

Each stage 11 includes a pair of opposite conductivity type solid state devices 17 and 18, which preferably are thin film transistors (TFT's). The conduction paths of TFT's 17 and 18 are series connected at a node 19. The control electrode of TFT 17 is connected to clock terminal 14-1 and thus receives clock C1. The conduction path of TFT 18 couples node 19 to clock terminal 15-1 when the TFT is turned on. The control electrode of TFT 18 is coupled to input terminal 12. Input terminal 12 of the first stage receives an input signal from a separate source, not shown. A second pair of opposite conductivity type TFT's 20 and 21 form an inverter, and the junction of their series connected conduction paths is connected to output terminal 13. The control electrodes of TFT's 20 and 21 are connected to node 19. The sources of TFT's 17 and 20 are coupled to biasing voltage $V_{DD}$ and the source of TFT 21 is connected to biasing voltage $V_{SS}$. Output terminal 13 of stage one is connected to select line 1 of the LCD display. The output terminals 13 of the ordinally numbered stages are connected to the similarly ordinally numbered select lines of the LCD display. Also, all stages of the shift register 10 are substantially identical to stage one. The select lines therefore are sequentially selected as each stage turns on the immediately succeeding stage.

Figure 2:
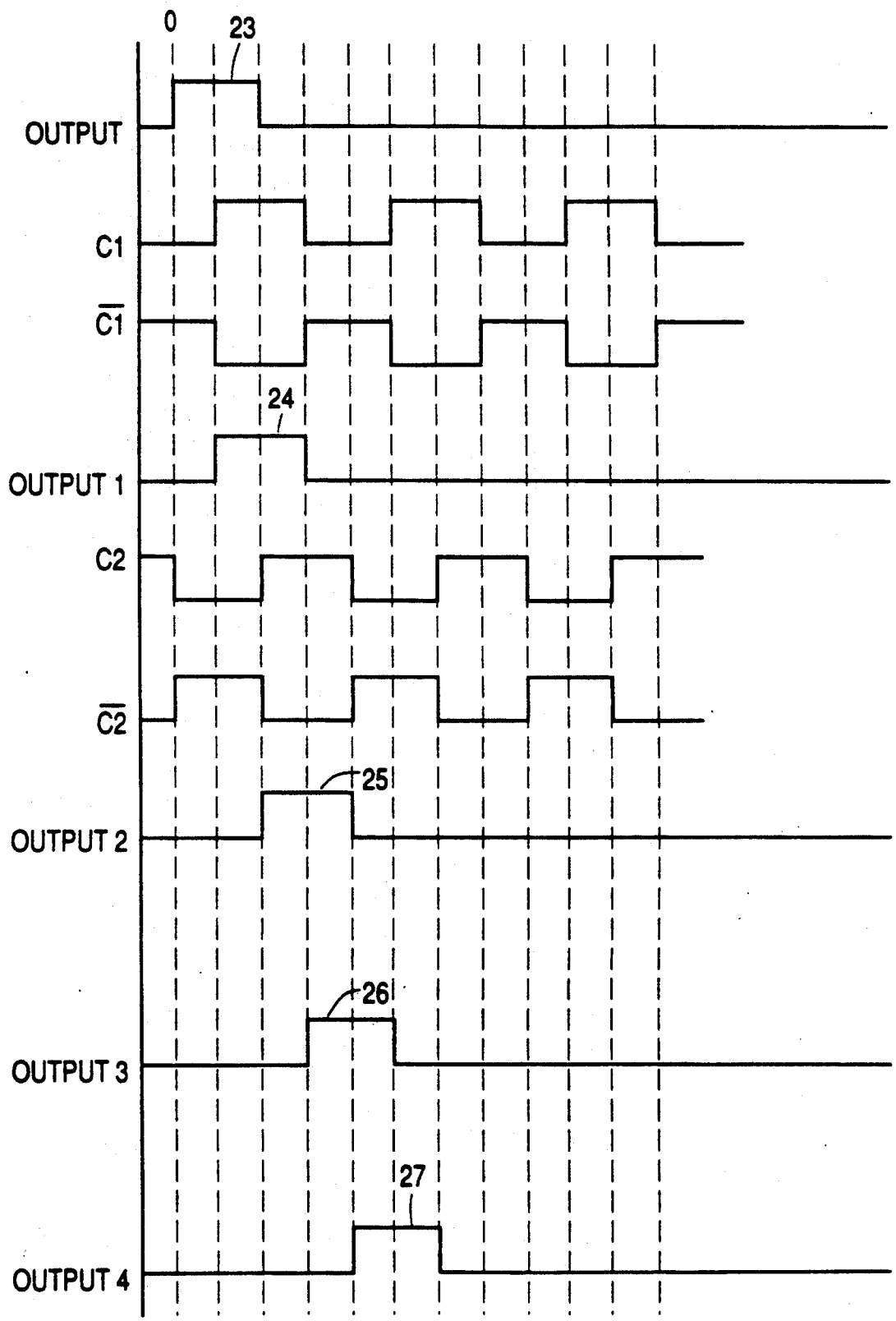
FIG. 2 shows the operational waveforms of the preferred embodiment of FIG. 1.

The operation can be understood from FIG. 1 and the waveforms of FIG. 2. Consider that TFT's 17 and 18 are respectively p-type and n-type transistors and that input terminal 12 and clock terminal 14-1 are low and clock terminal 15-1 is high. Transistor 17 is conditioned to conduct, pulling node 19 high and output terminal 13 is therefore low. On the occurrence of an input pulse (23) input terminal 12 goes high. However, clock terminal 14-1 remains low for a short period of time until clock C1 goes high. When clock C1 goes high, $\overline{C1}$ on clock terminal 15-1 simultaneously goes low. Transistor 17 is turned off and transistor 18 is conditioned into conduction. Node 19 is pulled low and output terminal 13 goes high, as shown by output 1 pulse 24 in FIG. 2. Select line 1 of the display is thus biased to a high voltage and data signals are applied by the data lines to the liquid crystal cells of the selected line of the display. Also, the output pulse on output terminal 13 of stage 1 serves as the input signal to the input terminal 12 of stage 2. Clock signals C1 and C2 are offset in phase, preferably by 90° in the preferred embodiment shown. Therefore, when the output of stage 1 initially goes high, stage 2 remains off because clock terminal 14-2 is low and clock terminal 15-2 is high. The output of stage 2 remains low until clock C2 goes high causing output terminal 13 of stage 2 to go high to select the second horizontal line of the display and to apply an input signal to stage 3. This operation of the stages within the first group continues until the last stage (stage 4 in the example given) applies an input pulse to the first stage (stage 5 in the example) of the next group at which time clock 1 raises the output terminal of the first stage of the second group.

In FIG. 2, clock signals C1 and C2 are offset in phase by 90° and therefore the output signals 24, 25, ,26 and 27 of the four stages are also 90° phase shifted. The speed of operation of the described shift register can be doubled by utilizing flour clocks which are 45° phase shifted. However, the advisability of implementing the increased speed is dependent upon the time required to charge all the liquid crystal cells within the chosen select line and accordingly the ability to use four clocks is dependent upon the characteristics of the display. Also, the output pulses can overlap because the fall sides of the output pulses lock the data onto the liquid crystal cells within the display. For the same reason, the output pulses can rise slowly, but should fall sharply.

What is claimed is:

1. A shift register operable with at least two phase-shifted clock signals and their complements, said shift register comprising a plurality of substantially identical stages, each of said stages having an input terminal and an output terminal, said stages being cascaded wherein the output terminal of each stage is connected to the input terminal of the immediately succeeding stage, said stages comprising:
   a first pair of opposite conductivity type solid state devices having conduction paths connected at a node, each of said solid state devices having a control electrode, the control electrode of a first of said solid state devices receiving one of said clock signals, the control electrode of the second of said solid state devices being connected to said input terminal, and the conduction path of said second solid state device receiving the complement of said clock signal;
   an inverter arranged between said node and said output terminal for holding the voltage on said output terminal opposite from that on said node, and for providing an input pulse to the succeeding stage of said shift register when said output terminal is high.

2. The shift register of claim 1 wherein said inverter includes a second pair of opposite conductivity type solid state devices having control electrodes connected to said node and having conduction paths connected to said output terminal.

3. The shift register of claim 2 wherein said solid state devices are thin film transistors.

4. A shift register comprising:
   a plurality of ordinally numbered substantially identical stages arranged in groups, each of said stages having an input terminal and an output terminal, said stages being cascaded wherein the output terminal of each stage is connected to the input terminal of the immediately succeeding stage, each of said stages also including first and second clock terminals;
   first clock means for applying a first clock signal to the first clock terminal of the first odd numbered stage of each group and to the second clock terminal of the second odd numbered stage of each group, and for applying a first complementary clock signal to the second clock signal of said first odd numbered stage and to the first clock terminal of said second odd numbered stage;
   second clock means for applying a second clock signal to the first clock terminal of the first even numbered stage of each group and to the second clock terminal of the second even numbered stage of each group, and for applying a second complementary clock signal to the second clock terminal of said first even numbered stage and to the first clock terminal of said second even numbered stage; and
   wherein each of said stages includes a first pair of opposite conductivity type solid state devices having conduction paths connected at a node, each of said solid state devices having a control electrode, the control electrode of the first of said solid state devices receiving one of said clock signals, the control electrode of the second of said solid state devices being connected to said input terminal, and the conduction path of said second solid state device receiving the complement of said one clock signal;
   an inverter arranged between said node and said output terminal for holding the voltage on said output terminal opposite from that on said node and for providing an input pulse to the succeeding stage of said shift register when said output terminal is high.

5. The shift register of claim 4 wherein said inverter includes a second pair of opposite conductivity type solid state devices having control electrodes connected to said node and having conduction paths connected to said output terminal.

6. The shift register of claim 5 wherein said solid state devices are thin film transistors.

7. The shift register of claim 4 wherein said first and second clock signals are phase shifted by a preselected phase angle.

8. The shift register of claim 7 wherein said phase angle is 90°.

* * * * *